United States Patent
Chen

(10) Patent No.: US 11,550,354 B2
(45) Date of Patent: Jan. 10, 2023

(54) SYSTEMS AND METHODS FOR MULTI-PHASE CLOCK GENERATION

(71) Applicant: Taiwan Semiconductor Manufacturing Company Limited, Hsinchu (TW)

(72) Inventor: Wei Chih Chen, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 106 days.

(21) Appl. No.: 17/080,920

(22) Filed: Oct. 27, 2020

(65) Prior Publication Data

US 2021/0255659 A1  Aug. 19, 2021

Related U.S. Application Data

(60) Provisional application No. 62/977,777, filed on Feb. 18, 2020.

(51) Int. Cl.
  *G06F 1/08* (2006.01)
  *H03L 7/085* (2006.01)
  (Continued)

(52) U.S. Cl.
  CPC .............. *G06F 1/08* (2013.01); *H03K 19/21* (2013.01); *H03L 7/085* (2013.01); *H03L 7/0998* (2013.01); *H03M 1/66* (2013.01)

(58) Field of Classification Search
  CPC ........ H03K 19/20; H03K 7/085; H03K 5/165; H03K 5/135; H03L 7/0998; H03L 7/091; H03L 7/087; H03L 7/07; H03L 7/0807; H03L 7/0812; H03L 7/08; H03L 7/0814; H03L 7/00; H03L 7/085; H03L 7/18; H03L 7/0816; H03L 7/099; G06F 1/04; G06F 1/06; G06F 1/08; G06F 1/10; G06F 1/12; H04L 7/0337; H04L 7/0025; H04L 7/033; H04L 7/0338; H04L 7/0037
  See application file for complete search history.

(56) References Cited

U.S. PATENT DOCUMENTS 5,844,436 A * 12/1998 Altmann .............. H03L 7/0814
  375/376
6,768,364 B2 * 7/2004 Wang ...................... H03H 7/21
  331/137

(Continued)

*Primary Examiner* — John W Poos
(74) *Attorney, Agent, or Firm* — Jones Day

(57) ABSTRACT

Systems and methods are provided for a clock generator is configured to generate N clock signals evenly spaced by phase. A clock generator includes a poly phase filter configured to utilize a differential clock signal to generate N intermediate signals, the intermediate signals being spaced approximately 360/N degrees apart in phase. A phase error corrector is configured to receive the intermediate signals and to generate N clock output signals, where a phase error is a measure of a difference in phase between consecutive ones of the clock output signals from 360/N degrees, the phase error corrector being configured to reduce phase error among the clock output signals based on a feedback signal. A phase error detection circuit is configured to receive the clock output signals and to generate the feedback signal based on detected phase errors among the clock output signals.

20 Claims, 10 Drawing Sheets

(51) Int. Cl.
*H03K 19/21* (2006.01)
*H03L 7/099* (2006.01)
*H03M 1/66* (2006.01)

(56) References Cited

U.S. PATENT DOCUMENTS

| | | | |
|---|---|---|---|
| 10,903,841 B1* | 1/2021 | Parvizi | H03L 7/18 |
| 11,271,710 B1* | 3/2022 | Cho | H04L 7/0016 |
| 2016/0147563 A1* | 5/2016 | Prakah-Asante | G06F 9/546 |
| | | | 719/314 |
| 2018/0175843 A1* | 6/2018 | Lee | H03K 5/15033 |

* cited by examiner

| Mode | xor_A | xor_Ab | xor_B | xor_Bb | PEDD = 1 |
|---|---|---|---|---|---|
| 00 | CK_IP | CK_IN | CK_QP | CK_QN | ph(QP) - ph(IP) <90° |
| 01 | CK_QN | CK_QP | CK_IP | CK_IN | ph(IP) - ph(QN) <90° |
| 10 | CK_QP | CK_QN | CK_IP | CK_IN | ph(IP) - ph(QP) <90° |
| 11 | CK_IN | CK_IP | CK_QP | CK_QN | ph(QP) - ph(IN) <90° |

SYSTEMS AND METHODS FOR MULTI-PHASE CLOCK GENERATION

CROSS-REFERENCE TO RELATED APPLICATIONS

This application claims priority to U.S. Provisional Application No. 62/977,777, filed Feb. 18, 2020, entitled "Quadrature Clock Generator" which is incorporated herein by reference in its entirety.

TECHNICAL FIELD

This disclosure is related to clock generators and particularly multi-phase clock generation architectures.

BACKGROUND

Modern devices, including mobile communication devices, continue to demand for faster data processing and higher data bandwidths. This demand drives aggressive scaling of communication data rates. Increased data rates and corresponding clock speeds result in significant power consumption concerns, particularly for power constrained (e.g., battery powered) devices.

BRIEF DESCRIPTION OF THE DRAWINGS

Aspects of the present disclosure are best understood from the following detailed description when read with the accompanying figures.

DETAILED DESCRIPTION

Figure 1:
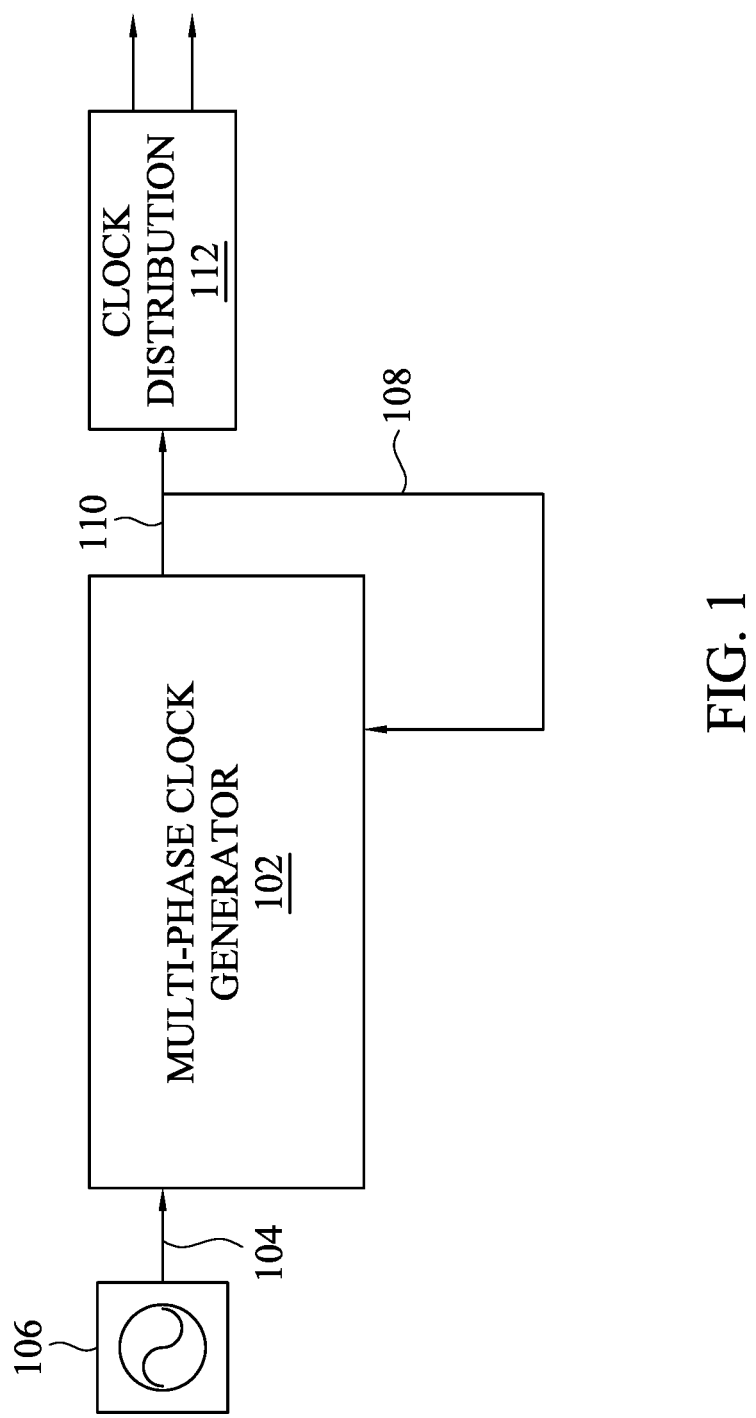
FIG. 1 is a block diagram depicting a multi-phase clock generator in accordance with an embodiment.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

High speed operations and communications often correspond with high power consumption. For example, many high speed communications utilize high speed clocks and corresponding high speed oscillators that can be a significant power drain. This can materially affect performance, particularly in power constrained (e.g., battery powered) devices. Systems and methods as described herein can enable increased operating and communications speed without requiring faster input clocks.

FIG. 1 is a block diagram depicting a multi-phase clock generator in accordance with an embodiment. A multi-phase clock generator 102 receives an input clock signal 104 (e.g., a differential clock signal), such as directly from an oscillator 106 (or a signal indirectly from an oscillator, such an oscillator signal post intermediate processing). The multi-phase clock generator 102 generates a multi-phase clock that can facilitate operations at a higher frequency than the input clock signal 104. In one example, the multi-phase clock generator 102 includes a poly phase filter (described in further detail below) that uses the input clock signal 104 to generate N intermediate signals, the intermediate signals being spaced approximately 360/N degrees apart in phase. In embodiments, the multi-phase clock generator 102 further includes a phase error corrector (described in further detail below) that is configured to generate N clock output signals 110, where the phase error corrector is configured to reduce phase error among the signals (e.g., a difference in phase between consecutive ones of the clock output signals from 360/N degrees) based on a feedback signal 108 in conjunction with a phase error detector. The N clock output signals 110 may be provided to a clock distribution module 112 for forwarding to circuitry (e.g., modules on the same integrated circuit as the multi-phase clock generator 102, modules on a different integrated circuit) for use in operations and communications.

Figure 2:
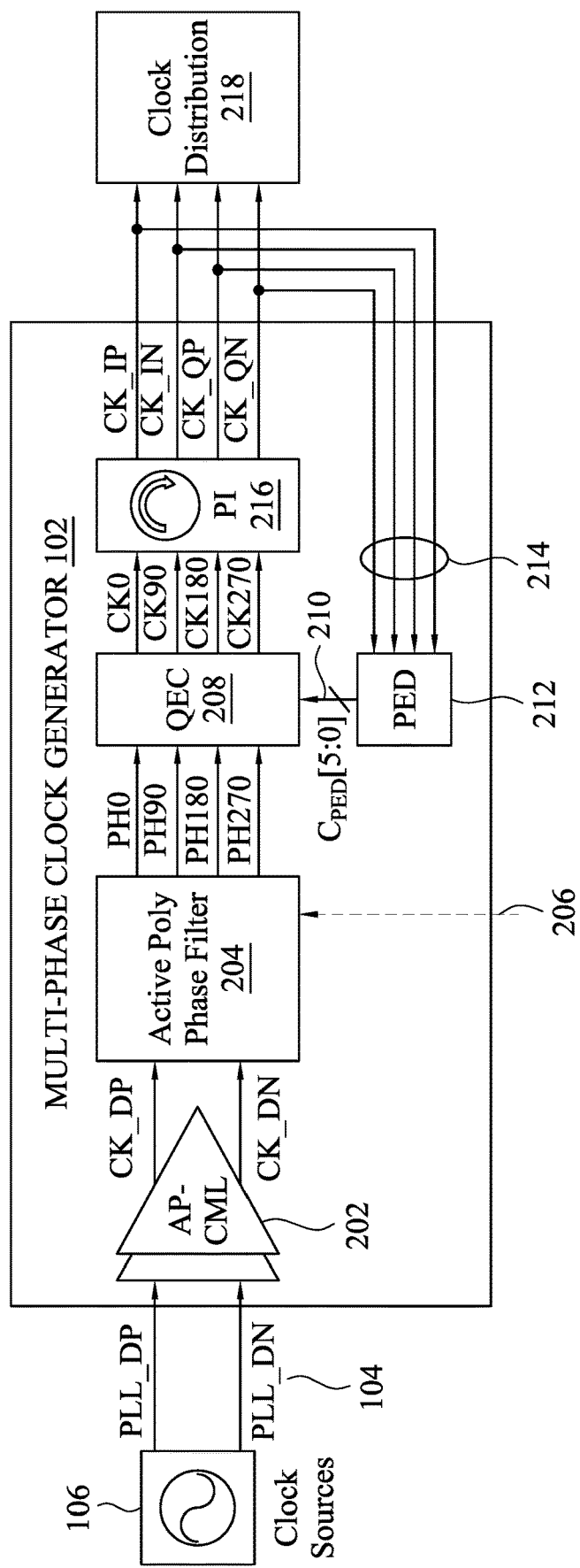
FIG. 2 depicts an example implementation of a multi-phase clock in accordance with embodiments.

FIG. 2 depicts an example implementation of a multi-phase clock in accordance with embodiments. A multi-phase clock generator 102 receives a differential input clock signal 104 from an external oscillator 106 (e.g., from a phase lock loop responsive to the oscillator 106). A current mode logic module 202 receives the input clock signal 104 (PLL_DP, PLL_DN) and generates a differential clock signal (CK_DP, CK_DN). In embodiments the current mode logic module is configured to remove a DC offset from the input clock signal (PLL_DP, PLL_DN). In some embodiments, the current mode logic module 202 is an active peaking current mode logic module that includes a current source that is controlled to provide a gain at a predetermined frequency.

The differential clock signal (CK_DP, CK_DN) is utilized by a poly phase filter 204 to generate N intermediate signals spaced apart in phase. In embodiments, the phase spacing is controllable by an input parameter 206, where characteristics of circuit elements described further herein are adjustable (e.g., a potentiometer for adjusting a target resistance, a switched bank of capacitors for adjusting a target capacitance) based on the input parameter 206 to control spacing of the N intermediate signals. For example, the input parameter 206 may indicate that 3 intermediate signals spaced 120 degrees apart should be generated. And the input parameter 206 may further be adjusted to indicate that 4 intermediate signals spaced 90 degrees apart, where the poly phase filter 204 is configured to adjust its characteristics, as described further herein, to provide the desired intermediate signal spacing. The example of FIG. 2 illustrates the poly phase filter 204 providing N=4 intermediate signals spaced approximately 360/N=360/4=90 degrees apart in phase (i.e., PH0, PH90, PH180, PH270).

Figure 3:
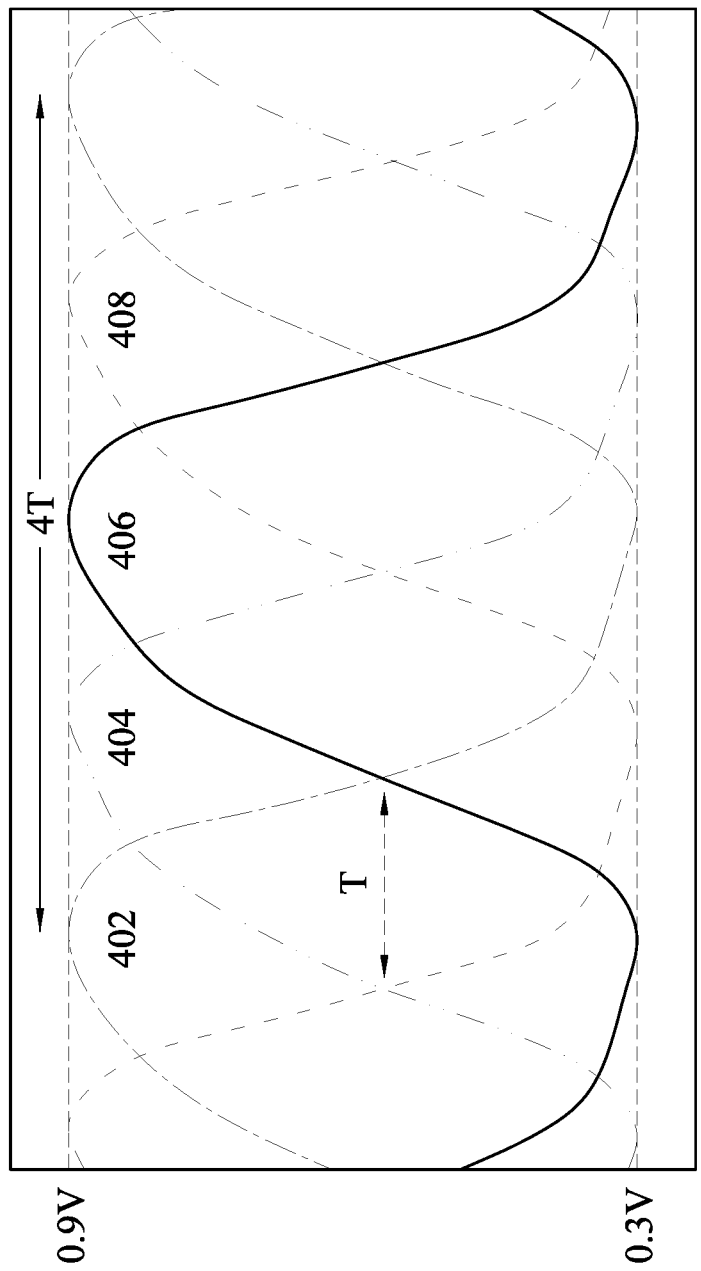
FIG. 3 is a diagram depicting four intermediate signals spaced approximately 90 degrees apart in phase generated by a poly phase filter, in accordance with embodiments.

FIG. 3 is a diagram depicting four intermediate signals spaced approximately 90 degrees apart in phase generated by a poly phase filter, in accordance with embodiments. In the example of FIG. 3, circuit component parameters of the poly phase filter are configured to provide 90 degree spacing of four intermediate signals. The four intermediate signals are depicted in FIG. 3 at 302, 304, 306, 308. The period of each intermediate signal is 4T. Multi-phase clocking can be implemented by recognizing a clock transition at characteristic points of the four, spaced intermediate signals 302, 304, 306, 308. For example, clock transitions can be measured at maximum or minimum points (e.g., where any one of the intermediate signals 302, 304, 306, 308 reaches 0.9 V or 0.3 V) or clock transitions can be measured at intermediate points (e.g., where a descending intermediate signal crosses 0.6 V). Such a multi-phase clock has a period (T) that is one-fourth the period of any component intermediate signal (4T), enabling generation of a multi-phase clock having a frequency four times that of the clock received at the poly phase filter input (e.g., T=1/(4*Fclk), Fclk=18 GHz).

With reference back to the example of FIG. 2, where N=4 and four intermediate signals (PH0, PH90, PH180, and PH270) are generated by the poly phase filter approximately 360/N=90 degrees apart in phase, a phase error corrector (quadrature error corrector 208) receives the four intermediate signals and generates N=4 clock output signals (CK0, CK90, CK180, CK270). The phase error corrector 208 is configured to reduce phase error among the clock output signals based on a feedback signal 210. Phase error is a measure of a difference in phase between consecutive ones of the clock output signals (CK0, CK90, CK180, CK270) from 360/N=90 degrees. So if the phase difference between CK90 and CK0 is 92 degrees, then the phase error between those consecutive clock output signals is +2 degrees. If the phase difference between CK180 and CK90 is 86 degrees, then the phase error between those consecutive output signals is −4 degrees. If the phase error between CK0 and CK270 is 90 degrees, then the phase error between those consecutive output signals is zero degrees. A phase error circuit detector 212 is configured to receive the clock output signals at 214 and to generate the feedback signal 210 based on detected phase errors among the clock output signals 214. In embodiments, the phase error corrector 208 includes a phase interpolator 216 that processes the clock output signals. A clock distribution module 218 receives the clock output signals (e.g., with or without intermediate processing by a phase interpolator 216) and forwards the clock output signals to downstream circuitry to utilize the multi-phase clock output signals.

Figure 4:
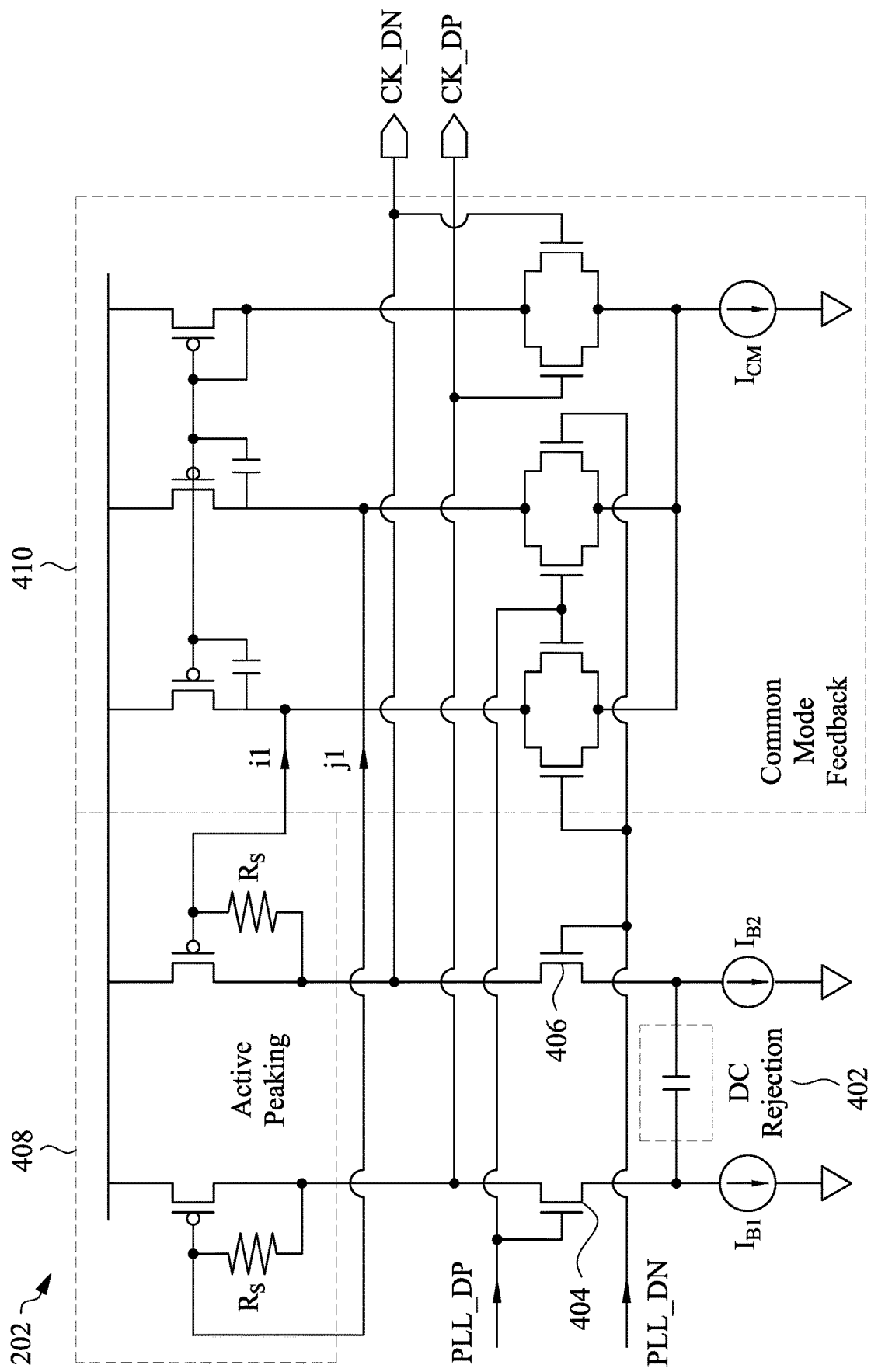
FIG. 4 is a diagram depicting an active peaking current mode logic module in accordance with embodiments.

As noted above with respect to FIG. 2, the current mode logic module 202 may receive an input clock signal (PLL_DP, PLL_DN) (e.g., from an external oscillator or a phase lock loop), where the current mode logic module 202 is configured to generate the differential clock signal (CK_DP, DK_DN). FIG. 4 is a diagram depicting an active peaking current mode logic module in accordance with embodiments. The active peaking current mode logic module 202 receives the input clock signal 104 (PLL_DP, PLL_DN) and generates a differential clock signal (CK_DP, CK_DN). The current mode logic module 202 is configured to remove a DC offset from the input clock signal (PLL_DP, PLL_DN). And the depicted current mode logic module 202 is an active peaking current mode logic module that includes a current source that is controlled to provide a gain at a predetermined frequency. Specifically, the current mode logic module 202 includes a DC rejection component 402, having capacitor-tied current sources $I_{B1}$ and $I_{B2}$, that pulls down the voltage of each of the input clock signal levels (PLL_DP, PLL_DN) via transistors 404, 406 whose gates are controlled by respective ones of those input clock signal levels.

Figure 5:
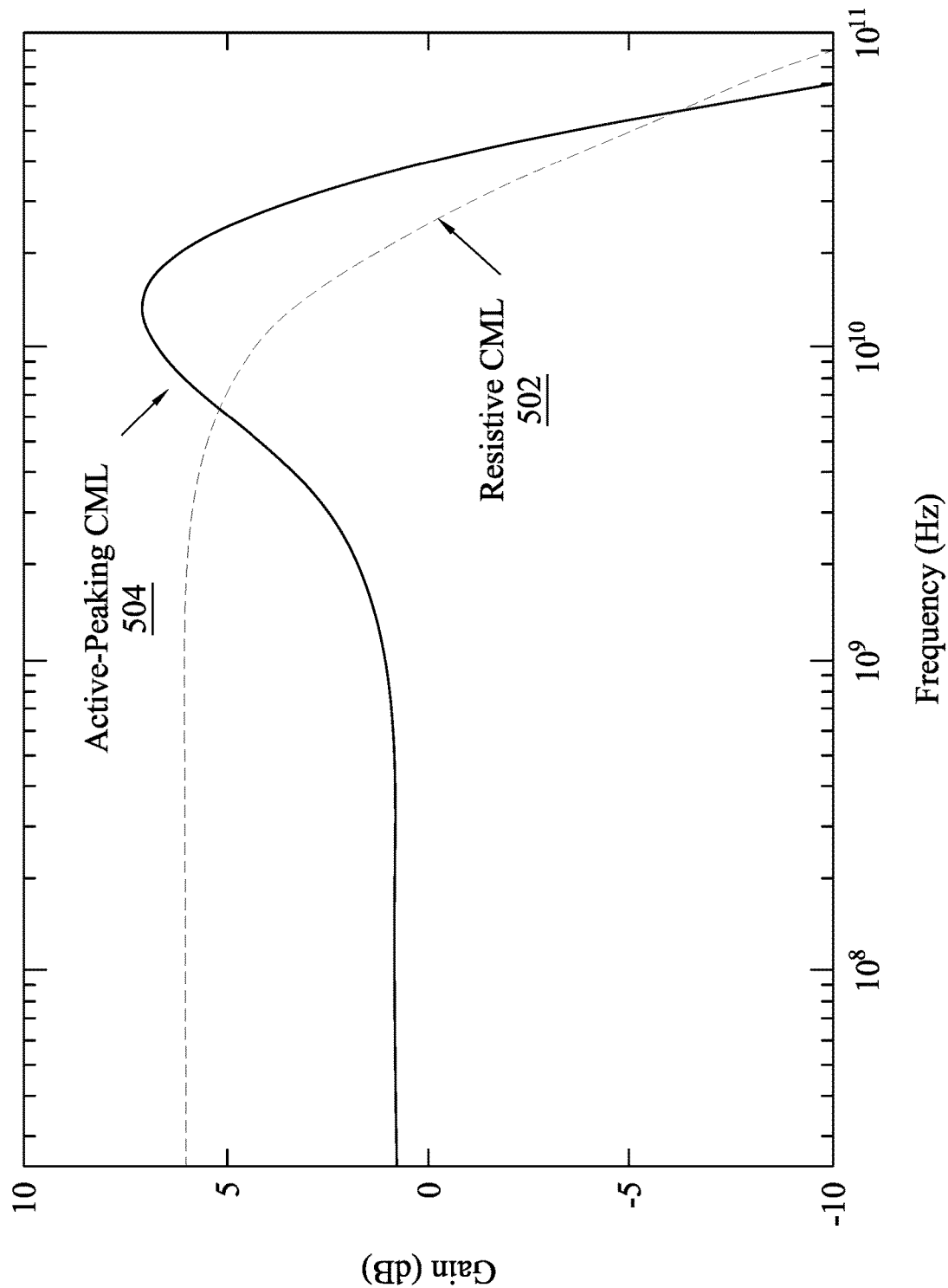
FIG. 5 is a frequency response diagram for an active peaking current mode logic module in accordance with an embodiment.

The DC rejection capacitors 404, 406 are further connected to an active peaking module 408. The active peaking module 408 provides a gain to the input clock signal (PLL_DP, PLL_DN) at the predetermined frequency via current source i1, whose frequency gain is controlled by a resistance (Rs) of the active peaking module 408, which in embodiments is controllable (e.g., one or more potentiometers controlled by a user-controllable input parameter 206). The current source i1, with controlled gain at the predetermined frequency, is provided to a common mode feedback module 410. The common mode feedback module 410 provides filtering of the received input clock signal (PLL_DP, PLL_DN) after dc offset removal. The common mode feedback module 410 provides low pass filtering of the processed input clock signal. The common mode feedback module 410, receiving active peaking current source i1 as an input provides active filtering as depicted in FIG. 5. FIG. 5 is a frequency response diagram for an active peaking current mode logic module in accordance with an embodiment. A resistive CIVIL plot 502 illustrates the low pass filter profile of the common mode feedback module 410 on its own, where the active peaking CML plot 504 illustrates an example effect of the receipt of current source i1 from the active peaking module 408 at the current mode feedback module 410, where the addition of the current source i1 enables control and biasing of the common mode feedback module 410 to provide targeted gain at the predetermined frequency.

Figure 6:
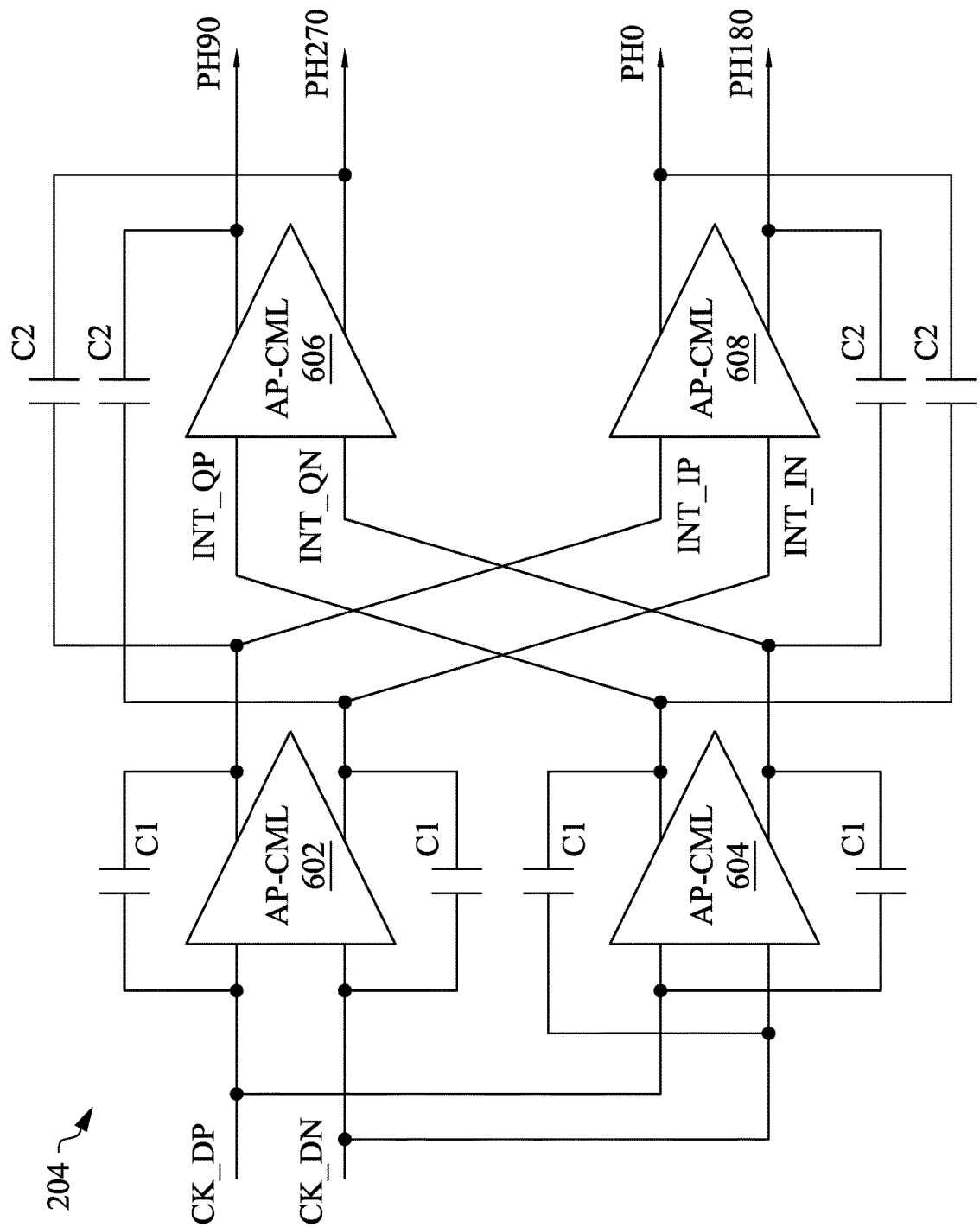
FIG. 6 is a diagram depicting an example active poly phase filter in accordance with embodiments.

With reference back to FIG. 2, a poly phase filter 204 is configured to utilize the differential clock signal (CK_DP, CK_DN) to generate N intermediate signals (e.g., PH0, PH90, PH180, PH270 when N=4) spaced approximately 360/N degrees apart in phase. FIG. 6 is a diagram depicting an example active poly phase filter in accordance with embodiments. The poly phase filter 204 includes a plurality of active peaking current mode logic buffers 602, 604, 606, 608 arranged in a multi-layer format, with buffers 602, 604 forming a first layer and buffers 606, 608 forming a second layer. Buffers 602, 604 each receive the differential clock signal inputs (CK_DP, CK_DN), where the outputs of the buffers 602, 604 are shunted to their inputs via shunt feedback capacitors C1. Buffer 606 receives the outputs of buffer 604 (INT_QP, INTQ) and buffer 608 receives the outputs of buffer 602 (INT_IP, INT_IN). The outputs of buffers 606, 608 are shunted to the inputs of the other buffer (e.g., the outputs of buffer 606 are shunted to the inputs of buffer 608) via capacitors C2. Buffer 608 provides two intermediate signals PH0, PH180, while buffer 606 provides intermediate signals PH90, PH270 in the example of FIG. 6.

The example of FIG. 6 can produce quadrature intermediate clock signals spaced approximately 90 degrees in phase (e.g., as depicted in FIG. 3). The use of active peaking current mode logic buffers at 602, 604, 606, 608 in this example mitigates signal attenuation. The poly phase intermediate signals (e.g., 302, 304, 306, 308) are spaced based on pole frequencies fp1 and fp2. The desired spacing (e.g., 90 degrees for N=4 quadrature phase generation) is set by the product of capacitance and the active peaking current mode logic output impedance as follows:

$f_{p1} = \frac{1}{2\pi R_M C_1}$ $f_{p2} = \frac{1}{2\pi R_M C_2}$, where $C_1$ & $C_2$=Shunt feedback Capacitance $R_M = R_S // rout$ $R_S$=active-peak series resistor rout=output impedance of APCML In embodiments, certain circuit parameters may be controlled (e.g., $R_M$ via a potentiometer, C1, C2 via a switched bank of capacitors) to affect phase spacing of the poly phase filter outputs.

Figure 7:
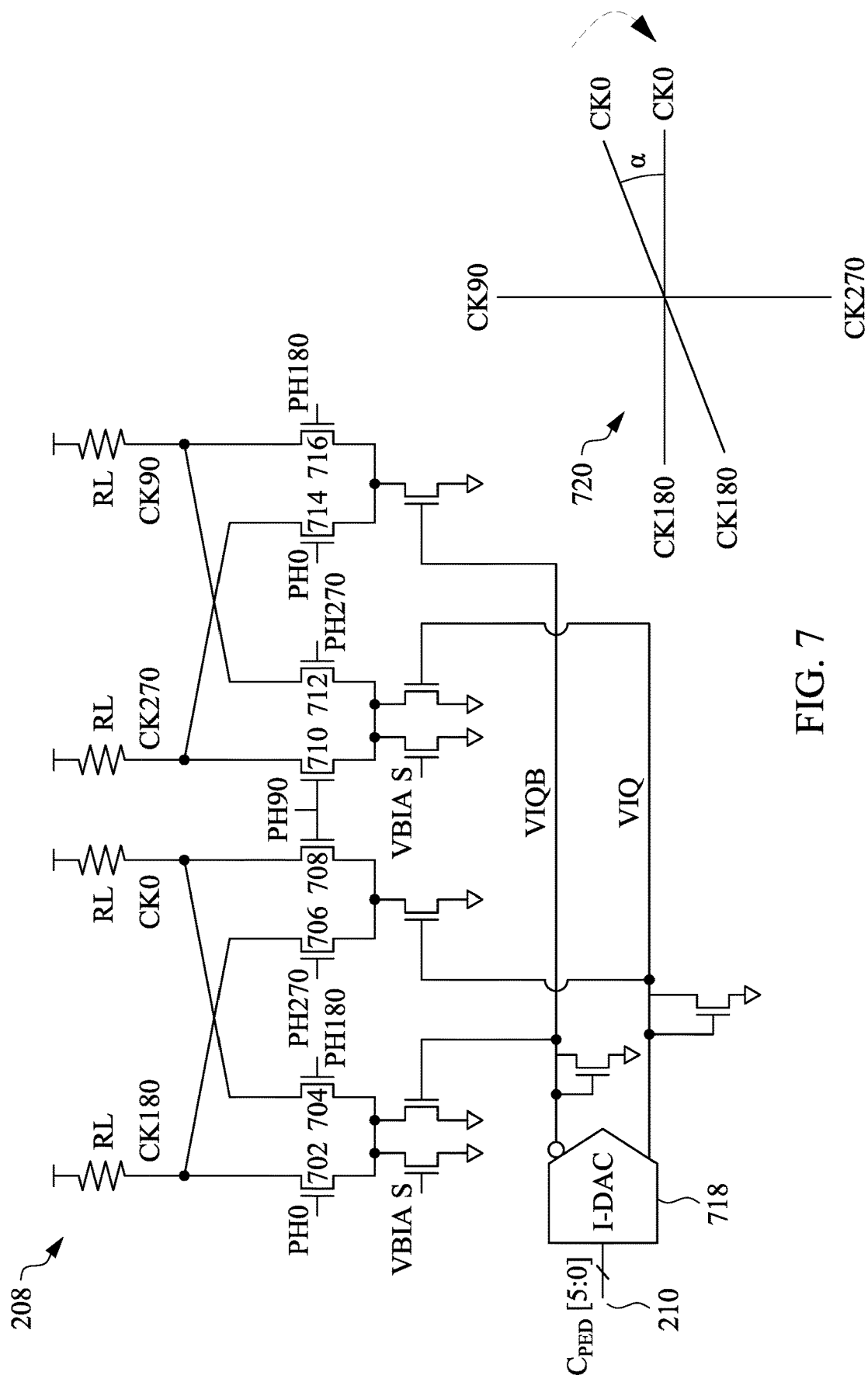
FIG. 7 is a diagram depicting a phase error corrector in accordance with embodiments.

With reference back to FIG. 2, a phase error corrector 208 receives the intermediate signals (PH0, PH90, PH180, PH270) to generate N=4 clock output signals (CK0, CK90, CK180, CK270). The phase error corrector 208 is configured to reduce phase error among the clock output signals based on a feedback signal 210. FIG. 7 is a diagram depicting a phase error corrector in accordance with embodiments. The phase error detector 208 receives the intermediate signals (PH0, PH90, PH180, PH270), which are provided to respective control gates of phase corrector transistors 702, 704, 706, 708, 710, 712, 714, 716. Output nodes (CK0, CK90, CK180, CK270) are connected to terminals of two phase corrector transistors associated with consecutive intermediate signals, and voltages at those output nodes are pulled down via current through those phase corrector transistors. Specifically, node CK0 is connected to phase corrector transistors associated with PH90 and PH180; node CK90 is connected to phase corrector transistors associated with PH180 and PH270; node CK180 is connected to phase corrector transistors associated with PH270 and PH0; and node CK270 is connected to phase corrector transistors associated with PH0 and PH90. The amount of pull down current is controlled by a difference in control voltages $V_{IQ}$, $V_{IQB}$ relative to $V_{BIAS}$. $V_{IQ}$, $V_{IQB}$ are set based on the feedback signal $C_{PED}$. In the example of FIG. 7, the feedback signal is a six bit digital signal, having one bit representative of a sign (+/−) and five bits representative of a magnitude. A digital to analog converter 718 converts the feedback signal 210 into differential control voltages $V_{IQ}$, $V_{IQB}$, which are used to tune the pull down strength of the phase corrector transistors 702, 704, 706, 708, 710, 712, 714, 716 based on the voltage of the control voltages $V_{IQ}$, $V_{IQB}$ relative to $V_{BIAS}$, where $V_{IQ}$ is provided to comparison transistors associated with PH90, PH270 and $V_{IQB}$ is provided to comparison transistors associated with PH0, PH180. In one embodiment, the most significant bit of the digital feedback signal is a sign bit, with the remaining bits representing 30, 60, 90, 150 fs of phase shift enabling phase tuning resolution of ±0.96 to ±4.8 ps.

The diagram at 720 illustrates a phase error between CK0 and CK90 of α degrees, where the phase error corrector operates to shift CK0 by −α degrees relative to CK90 to CK0'. The diagram 720 also illustrates a phase error between CK270 and CK180 of −α degrees, where the phase error corrector operates to shift CK180 by +α relative to CK270 to CK180'.

With reference back to FIG. 2, the phase error corrector 208 generates the clock output signals (CK0, CK90, CK180, CK270) (which in embodiments may be further processed by a phase interpolator 216 prior to distribution at 218). The clock signals (with or without processing at 216) are provided at 214 to a phase error detector 212 to generate the feedback signal 210 based on detected phase errors among the clock output signals 214.

Figure 8:
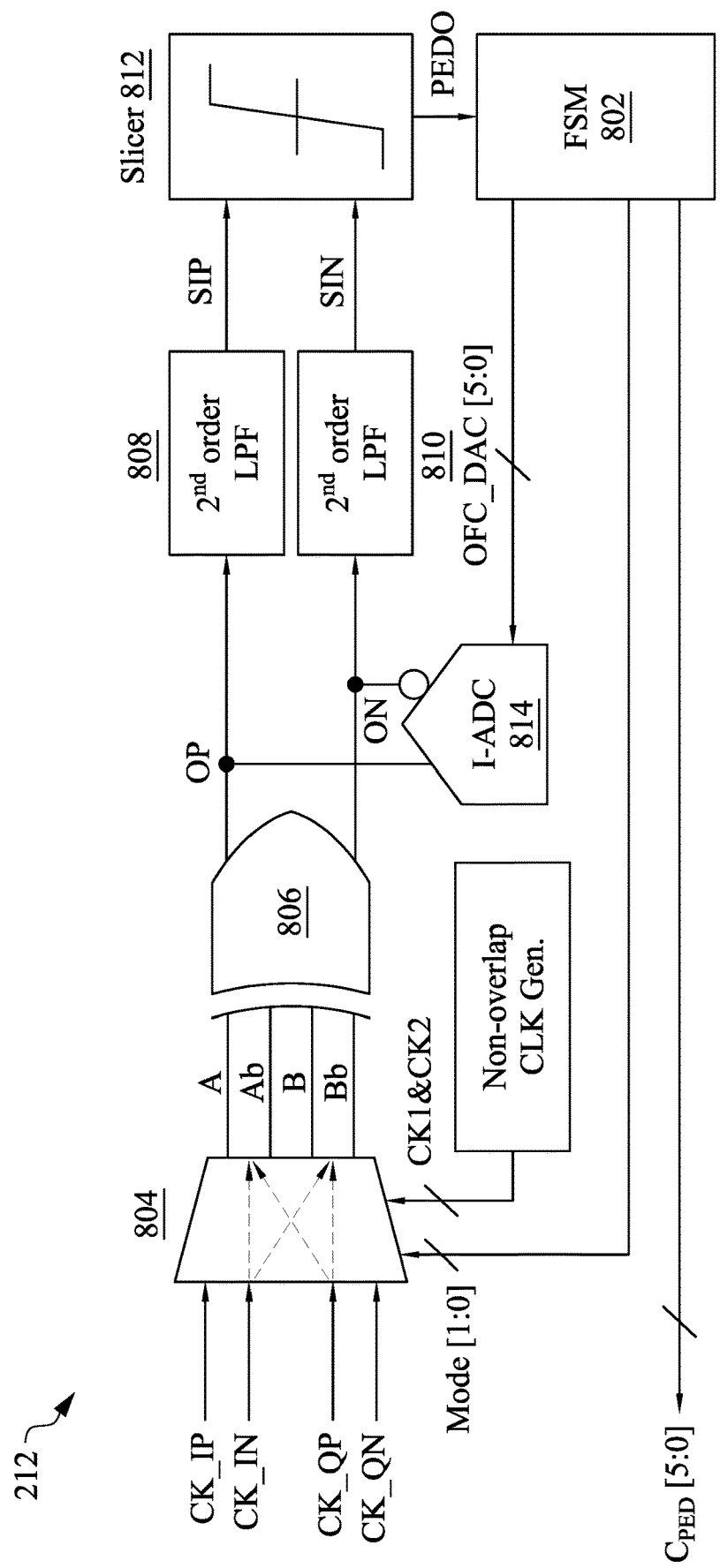
FIG. 8 is a diagram depicting a phase error detector implementation in accordance with an embodiment.

FIG. 8 is a diagram depicting a phase error detector implementation in accordance with an embodiment. The example phase error detector 212 rotates through a series of modes of operation, each mode comparing the phases of consecutive ones of the clock output signals to determine phase error between those clock output signals, where phase error is a measure of a difference in phase between consecutive ones of the clock output signals from 360/N degrees. For example, a first mode compares a phase of a first clock output signal to a phase of a second clock output signal and adjusts the feedback signal ($C_{PED}$) in a first direction if a phase difference between the first clock output signal and the second clock output signal is less than 360/N degrees and adjusts the feedback signal in a second direction if greater than 360/N degrees.

The phase error detector 212 includes a finite state machine 802 that controls operation of the phase error detector 212. In the example of FIG. 8, N=4 and four clock output signals (CK_IP, CK_IN, CK_QP, CK_QN) are received by the phase error detector 212. When N=4, the phase error detector operates in four modes. As noted above a first mode (Mode 00) compares a phase of a first clock output signal (QP) to a phase of a second clock output signal (IP) and adjusts the feedback signal in a first direction if a phase difference between the first clock output signal and the second clock output signal is less than 90 (e.g., PH(QP)−PH(IP)<90) degrees and adjusts the feedback signal in a second direction if greater than 360/N degrees (e.g., PH(QP)−PH(IP)>90). A second mode (Mode 01) compares a phase of the second clock output signal (IP) to a phase of a third clock output signal (QN) and adjusts the feedback signal in the first direction if a phase difference between the second clock output signal and the third clock output signal is less than 90 degrees (e.g., PH(IP)−PH(QN)<90) and adjusts the feedback signal in the second direction if greater than 90 degrees (e.g., PH(IP)−PH(QN)>90). A third mode (Mode 10) compares a phase of the third clock output signal (QN) to a phase of a fourth clock output signal (IN) and adjusts the feedback signal in the first direction if a phase difference between the third clock output signal and the fourth clock output signal is less than 90 degrees (e.g., PH(QN)−PH(IN)<90) and adjusts the feedback signal in the second direction if greater than 90 degrees (e.g., PH(QN)−PH(IN)>90). A fourth mode (Mode 11) compares a phase of the fourth clock output (IN) signal to a phase of a first clock output signal (QP) and adjusts the feedback signal in the first direction if a phase difference between the fourth clock output signal and the first clock output signal is less than 90 degrees (e.g., PH(IN)−PH(QP)<90) and adjusts the feedback signal in the second direction if greater than 90 degrees (e.g., PH(IN)−PH(QP)>90).

The phase error detector includes a multiplexer for selecting the two clock output signals to be considered in the current mode and their complements according to a control signal from the finite state machine 802, and an exclusive-OR gate (e.g., a current mode logic gate) 806 compares the selected clock signals. Second order filters 808, 810 (e.g., f3db~100 MHz) accumulate the phase difference and a slicer 812 determines the quadrature error. As will be described in further detail below, when a first of two signals being compared has a leading phase error (e.g., the phase error is greater than 360/N), then the digital feedback signal $C_{PED}$ is increased in magnitude, and when the first of the two signals being compared has a lagging phase error (e.g., the phase error is less than 360/N), then the digital feedback signal is decreased in magnitude. The direction and magnitude of the feedback signal affects the relative phase shifting of the clock output signals by the phase error corrector 208 as described above.

In embodiments, the finite state machine 802 may provide DC offset cancellation to the outputs of the XOR gate 806 prior to filtering at second order filters 808, 810. In an embodiment, the DC offset is cancelled by comparing slicer 812 outputs from Mode 00 to Mode 11; and Mode 01 to Mode 10 to detect a DC offset level, and providing a corresponding code to digital-to-analog converter 814, which applies a pulldown current to the OP/ON outputs of the XOR gate 806 prior to filtering.

Figure 9:
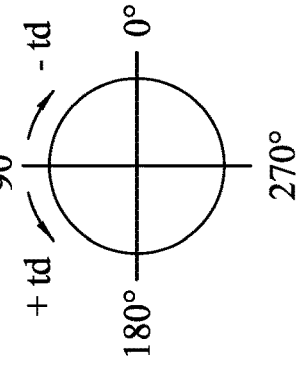
FIG. 9 is a diagram depicting phase error detection finite state machine controls in accordance with an embodiment.

FIG. 9 is a diagram depicting phase error detection finite state machine controls in accordance with an embodiment. When N=4, the phase error detector operates through four modes. The finite state machine 802 commands the multiplexer 804 to route the clock output signals (CK_IP, CK_IN, CK_QP, CK_QN) to the multiplexer 804 outputs, and corresponding XOR 806 gate inputs as shown to initiate the phase comparison shown in the right hand column. When the depicted comparison is true, the PEDO value is set to 1, and the value of the digital feedback signal is reduced to provide a corresponding adjustment at the phase error corrector 208. Conversely, when the depicted comparison is false, the PEDO value is set to 0, and the value of the digital feedback signal is increased to provide a corresponding adjustment at the phase error corrector 208.

Figure 10:
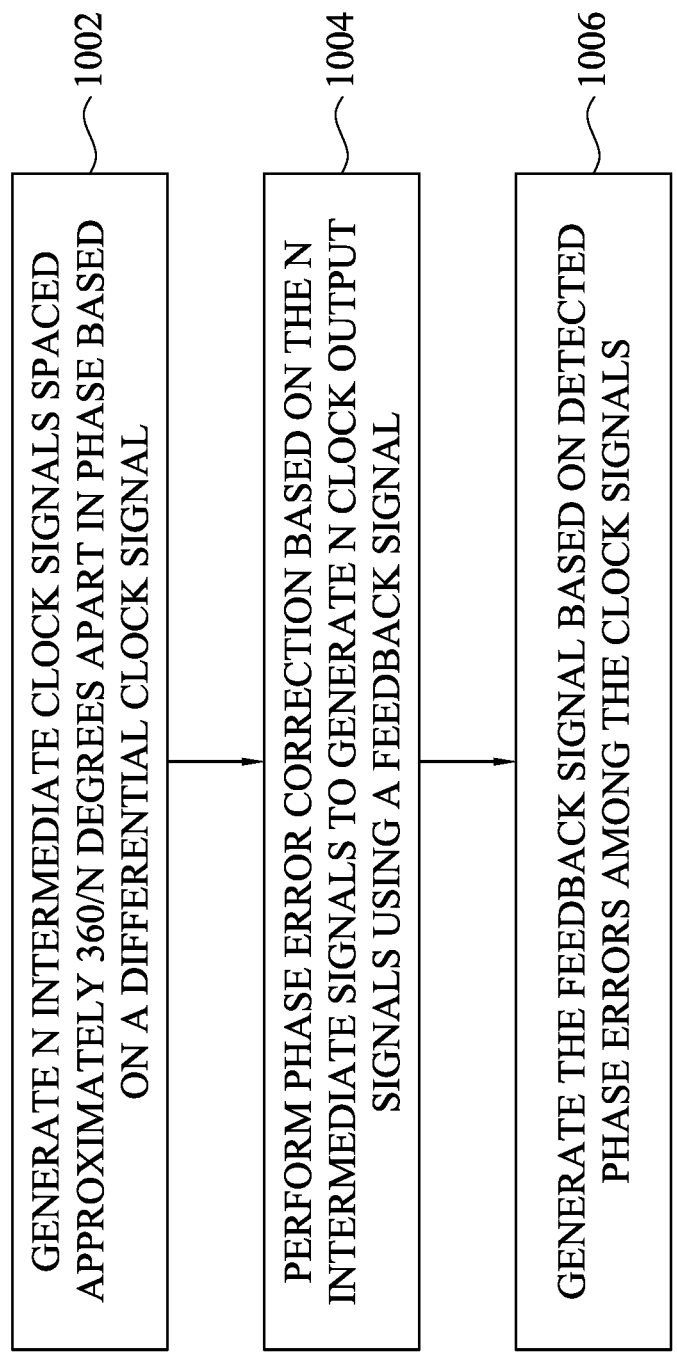
FIG. 10 is a flow diagram depicting a method of generating a set of multi-phase clock signals.

FIG. 10 is a flow diagram depicting a method of generating a set of multi-phase clock signals. While the flow diagram is described with reference to structures described above, it is understood that the method is applicable to many other structures as well. At 1002, a differential clock signal (CK_DP, CK_DN) is used to generate N intermediate signals (PH0, PH90, PH180, PH270) spaced approximately 360/N (90) degrees apart in phase (at the poly phase filter 204), where N(4) is greater than 2. A phase error correction is performed at 1004 based on the N intermediate signals (PH0, PH90, PH180, PH270) (at the phase error corrector 208) to generate N clock output signals (CK0, CK90, CK180, CK270), where a phase error is a measure of a difference in phase between consecutive ones of the clock output signals from 360/N degrees, where performing phase error correction reduces phase error among the clock output signals using a feedback signal (210). The feedback signal (210) is generated at 1006 (at phase error detector 212) based on detected phase errors among the clock output signals.

Use of the various processes as described herein can provide a number of advantages. For example, use of the subject matter can provide high speed clock signals using an oscillator that operates at a lower frequency than the provided high speed clock signals. Such systems and methods can provide significant power savings.

In one example, a clock generator is configured to generate N clock signals evenly spaced by phase. A clock generator includes a poly phase filter configured to utilize a differential clock signal to generate N intermediate signals, the intermediate signals being spaced approximately 360/N degrees apart in phase. A phase error corrector is configured to receive the intermediate signals and to generate N clock output signals, where a phase error is a measure of a difference in phase between consecutive ones of the clock output signals from 360/N degrees, the phase error corrector being configured to reduce phase error among the clock output signals based on a feedback signal. A phase error detection circuit is configured to receive the clock output signals and to generate the feedback signal based on detected phase errors among the clock output signals.

In another example, a method of generating a set of multi-phase clock signals includes using a differential clock signal to generate N intermediate signals spaced approximately 360/N degrees apart in phase, where N is greater than 2. Phase error correction is performed based on the N intermediate signals to generate N clock output signals, where a phase error is a measure of a difference in phase between consecutive ones of the clock output signals from 360/N degrees, where performing phase error correction reduces phase error among the clock output signals using a feedback signal. The feedback signal is generated based on detected phase errors among the clock output signals.

In a further embodiment, a quadrature clock generator configured to generate four clock signals evenly spaced by phase includes a poly phase filter configured to utilize a differential clock signal to generate four intermediate signals, the intermediate signals being spaced approximately 90 degrees apart in phase using four buffer modules arranged in two layers. A phase error corrector is configured to receive the four intermediate signals and to generate four clock output signals, where a phase error is a measure of a difference in phase between consecutive ones of the four clock output signals from 90 degrees, the phase error corrector being configured to reduce phase error among the clock output signals based on a feedback signal. A phase error detection circuit is configured to receive the clock output signals and to generate the feedback signal based on detected phase errors among the clock output signals.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A clock generator configured to generate N clock signals evenly spaced by phase, comprising:
   a poly phase filter configured to utilize a differential clock signal to generate N intermediate signals, the intermediate signals being spaced approximately 360/N degrees apart in phase;
   a phase error corrector configured to receive the intermediate signals and to generate N clock output signals, wherein a phase error is a measure of a difference in phase between consecutive ones of the clock output signals from 360/N degrees, the phase error corrector being further configured to receive a feedback signal and to reduce phase error among the clock output signals based on the feedback signal; and
   a phase error detector configured to receive the clock output signals and to generate the feedback signal based on detected phase errors among the clock output signals.

2. The clock generator of claim 1, wherein the phase error detector is configured operate in a plurality of modes, each mode detecting a phase error between two of the clock output signals, each mode updating the feedback signal based on the detected phase error.

3. The clock generator of claim 2, wherein a first mode compares a phase of a first clock output signal to a phase of a second clock output signal and adjusts the feedback signal in a first direction if a phase difference between the first clock output signal and the second clock output signal is less than 360/N degrees and adjusts the feedback signal in a second direction if greater than 360/N degrees.

4. The clock generator of claim 3, wherein N=4 and 360/N=90;

wherein a second mode compares a phase of the second clock output signal to a phase of a third clock output signal and adjusts the feedback signal in the first direction if a phase difference between the second clock output signal and the third clock output signal is less than 90 degrees and adjusts the feedback signal in the second direction if greater than 90 degrees;

wherein a third mode compares a phase of the third clock output signal to a phase of a fourth clock output signal and adjusts the feedback signal in the first direction if a phase difference between the third clock output signal and the fourth clock output signal is less than 90 degrees and adjusts the feedback signal in the second direction if greater than 90 degrees; and wherein a fourth mode compares a phase of the fourth clock output signal to a phase of a first clock output signal and adjusts the feedback signal in the first direction if a phase difference between the fourth clock output signal and the first clock output signal is less than 90 degrees and adjusts the feedback signal in the second direction if greater than 90 degrees.

5. The clock generator of claim 1, wherein the phase error detector comprises a multiplexer that selects two of the clock output signals based upon a current mode.

6. The clock generator of claim 5, wherein the phase error detector further comprises:
an XOR gate that processes the two selected clock output signals;
a low pass filter that receives an output of the XOR gate;
a slicer that processes an output of the low pass filter; and
a finite state machine that receives an output of the slicer and adjusts the feedback signal based on the received output of the slicer.

7. The clock generator of claim 1, wherein the feedback signal is a digital signal that is decoded by a digital-to-analog converter to provide an phase shift signal that is applied by the phase error corrector to the intermediate signals to reduce the phase error among the clock output signals.

8. The clock generator of claim 7, wherein a first bit of the digital signal represents a direction of phase shift and a second bit and third bit of the digital signal represent a magnitude of phase shift, the second bit representing a magnitude twice a magnitude of a third bit.

9. The clock generator of claim 1, further comprising a current mode logic module configured to receive an input clock signal and to generate the differential clock signal, the current mode logic module being configured to remove a dc offset from the input clock signal.

10. The clock generator of claim 9, wherein the current mode logic module is an active peaking current mode logic module that includes a current source that is controlled to provide gain at a predetermined frequency.

11. The clock generator of claim 1, wherein the poly phase filter comprises a plurality of buffers arranged in a multi-layer format.

12. The clock generator of claim 11, wherein the approximate 360/N spacing is controlled by one or more poly phase filter resistors and one or more poly phase filter capacitors.

13. The clock generator of claim 12, wherein a resistance or capacitance is adjustable based on a control signal to modify the approximate 360/N spacing provided by the poly phase filter.

14. The clock generator of claim 1, wherein the phase error corrector further comprises a phase interpolator.

15. A method of generating a set of multi-phase clock signals, comprising:
using a differential clock signal to generate N intermediate signals spaced approximately 360/N degrees apart in phase, where N is greater than 2;
performing phase error correction, by a phase error corrector, based on the N intermediate signals to generate N clock output signals, wherein a phase error is a measure of a difference in phase between consecutive ones of the clock output signals from 360/N degrees, wherein performing the phase error correction reduces phase error among the clock output signals using a feedback signal received by the phase error corrector; and
generating the feedback signal based on detected phase errors among the clock output signals.

16. The method of claim 15, wherein generating the feedback signal comprises:
cycling through N modes of phase detection operation, wherein in each mode of phase detection operation detects a phase error between two of the clock output signals and updates the feedback signal based on the detected phase error.

17. The method of claim 16, wherein a first mode compares a phase of a first clock output signal to a phase of a second clock output signal and adjusts the feedback signal in a first direction if a phase difference between the first clock output signal and the second clock output signal is less than 360/N degrees and adjusts the feedback signal in a second direction if greater than 360/N degrees.

18. The method of claim 15, further comprising:
receiving an input clock signal;
generating the differential clock signal using active current mode logic configured to remove a dc offset from the differential clock signal and providing a gain to the differential clock signal at a predetermined frequency.

19. A quadrature clock generator configured to generate four clock signals evenly spaced by phase, comprising:
a poly phase filter configured to utilize a differential clock signal to generate four intermediate signals, the intermediate signals being spaced approximately 90 degrees apart in phase using four buffer modules arranged in two layers;
a phase error corrector configured to receive the four intermediate signals and to generate four clock output signals, wherein a phase error is a measure of a difference in phase between consecutive ones of the four clock output signals from 90 degrees, the phase error corrector being further configured to receive a feedback signal and to reduce phase error among the clock output signals based on the feedback signal; and
a phase error detector configured to receive the clock output signals and to generate the feedback signal based on detected phase errors among the clock output signals.

20. The quadrature clock generator of claim 19, further comprising an active current mode logic module configured to receive a differential input clock signal from an oscillator, to remove a dc offset from the input clock signal, and to provide a gain to the input clock signal at a predetermined frequency.

* * * * *